(12) United States Patent
Ogawa

(10) Patent No.: US 12,176,231 B2
(45) Date of Patent: Dec. 24, 2024

(54) SUBSTRATE STORAGE CONTAINER

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 47 days.

(21) Appl. No.: 18/143,341

(22) Filed: May 4, 2023

(65) Prior Publication Data

US 2023/0274960 A1   Aug. 31, 2023

Related U.S. Application Data

(63) Continuation of application No. PCT/JP2021/024654, filed on Jun. 30, 2021.

(30) Foreign Application Priority Data

Dec. 2, 2020 (JP) ................................. 2020-200644

(51) Int. Cl.
*H01L 21/673* (2006.01)
*F16K 15/14* (2006.01)

(52) U.S. Cl.
CPC ........ *H01L 21/67389* (2013.01); *F16K 15/14* (2013.01)

(58) Field of Classification Search
CPC ........................... H01L 21/67389; F16K 15/14
USPC .................................................. 206/710, 711
See application file for complete search history.

(56) References Cited

U.S. PATENT DOCUMENTS

| | | | | |
|---|---|---|---|---|
| RE39,241 E | * | 8/2006 | Fosnight | B01D 46/88 55/482 |
| 8,403,143 B2 | * | 3/2013 | Chiu | H01L 21/67353 206/724 |
| 2005/0077204 A1 | * | 4/2005 | Sumi | H01L 21/67393 206/710 |
| 2010/0163452 A1 | * | 7/2010 | Lin | F16K 15/147 206/524.4 |
| 2013/0193033 A1 | * | 8/2013 | Lu | H01L 21/67393 206/710 |
| 2015/0014191 A1 | * | 1/2015 | Suzuki | H01L 21/67393 206/204 |
| 2015/0294889 A1 | | 10/2015 | Smith et al. | |

(Continued)

FOREIGN PATENT DOCUMENTS

| | | |
|---|---|---|
| JP | 2004179449 A | 6/2004 |
| JP | 2014160783 A | 9/2014 |
| JP | 2016503586 A | 2/2016 |

(Continued)

*Primary Examiner* — Jacob K Ackun
(74) *Attorney, Agent, or Firm* — The Webb Law Firm

(57) ABSTRACT

A substrate storage container includes a container body configured to store substrates, a lid that closes an opening of the container body, and a valve unit that controls the flow of gas to the container body. The valve unit includes an elastic valve having a valve opening that connects a first passage communicating with the outside of the container body to a second passage communicating with the inside of the container body, a holding member that holds the elastic valve, and a clamping cap that is inserted in the elastic valve and secures the elastic valve to the holding member. The valve opening is tightly closed by the elastic force of the elastic valve.

6 Claims, 17 Drawing Sheets

(56) References Cited

U.S. PATENT DOCUMENTS

2017/0271188 A1  9/2017  Fuller et al.

FOREIGN PATENT DOCUMENTS

| JP | 2018505546 A | 2/2018 |
| JP | 2019021735 A | 2/2019 |
| JP | 2019021736 A | 2/2019 |

* cited by examiner

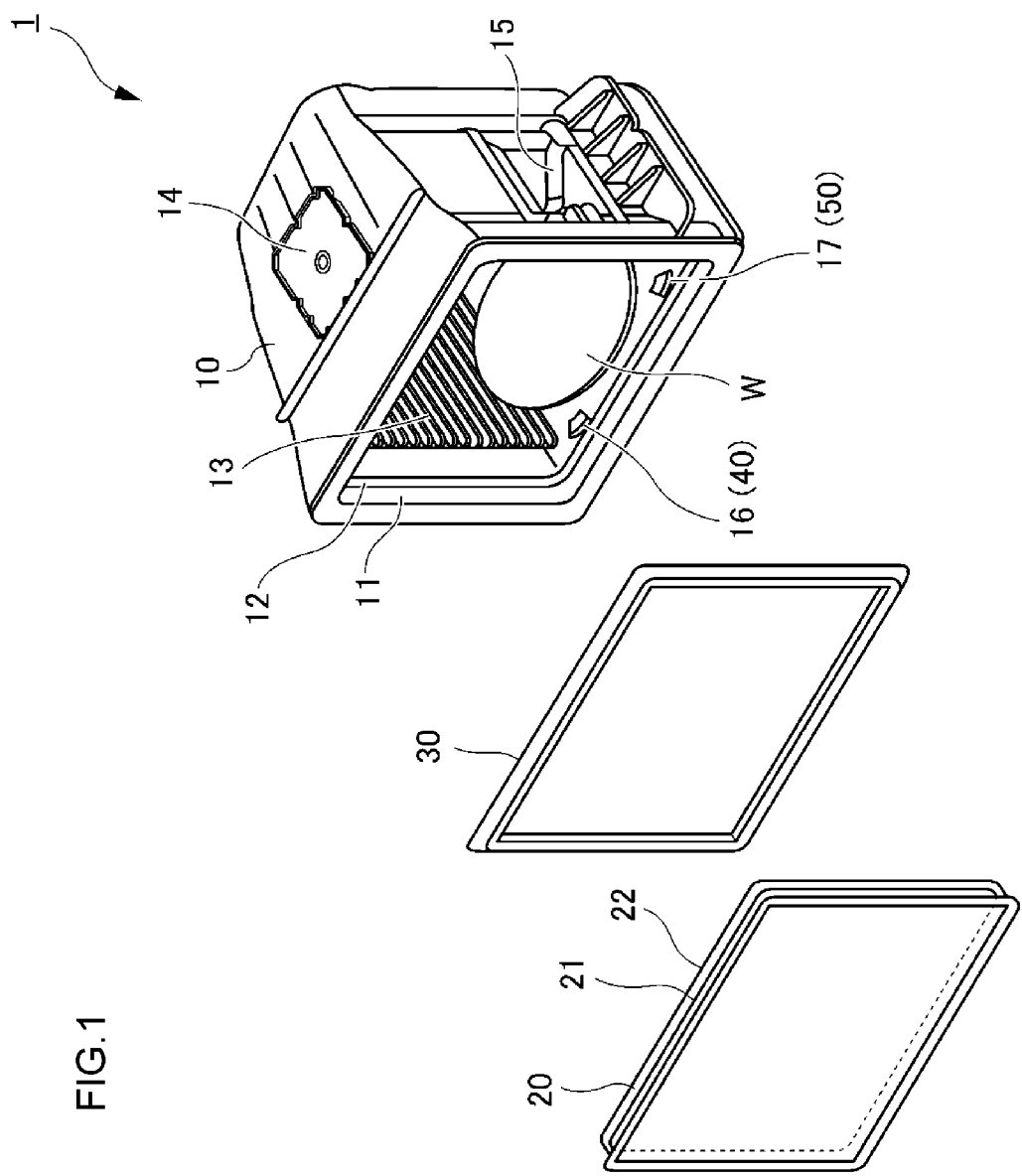

SUBSTRATE STORAGE CONTAINER

CROSS-REFERENCE TO RELATED APPLICATIONS

This application is a continuation of International Patent Application No. PCT/JP2021/024654 filed Jun. 30, 2021, and claims priority to Japanese Patent Application No. 2020-200644, filed Dec. 2, 2020, the disclosures of which are hereby incorporated by reference in their entireties.

BACKGROUND OF THE DISCLOSURE

Field of the Disclosure

Embodiments described herein relate generally to a substrate storage container with a valve unit that controls the flow of gas to the container body.

Description of Related Art

A substrate storage container for storing substrates generally has a container body, a lid that closes the opening of the container body, and a valve unit that controls the flow of gas to the container body. The valve unit functions as a check valve and includes a valve and an elastic metal member that opens and closes the valve (see, for example, Japanese Unexamined Patent Publication No. 2014-160783 and Japanese Unexamined Patent Publication No. 2004-179449).

Such a substrate storage container is supplied with and discharges gas through the valve unit to store substrates in an airtight condition. However, stored substrates sometimes have residues that have adhered thereto during the processing of the substrates, and the residues may also be discharged together with the supplied gas. As a result, the residues may corrode the elastic metal member of the valve unit and the like.

In addressing the above issues, the inventors have proposed a valve unit with an elastic valve that opens and closes a gas passage without using a metal member (see Patent Document 3). The valve unit has a valve opening/closing mechanism that closes a valve opening formed in the elastic valve with its elastic force and opens it with a gas pressure that exceeds the elastic force.

The valve unit disclosed in Japanese Unexamined Patent Publication No. 2019-021736, however, is made up of many parts including a fixed cylinder, a holding cylinder, an inner cover cylinder, and a plurality of O-rings, and therefore it requires time for assembly.

The present disclosure has been made to, at least to some extent, overcome the above disadvantages and provide a substrate storage container having a valve unit with improved assembly workability.

BRIEF DESCRIPTION OF THE DRAWINGS

FIG. 1 is an exploded perspective view of a substrate storage container according to an embodiment.

DETAILED DESCRIPTION

Figure 2A:
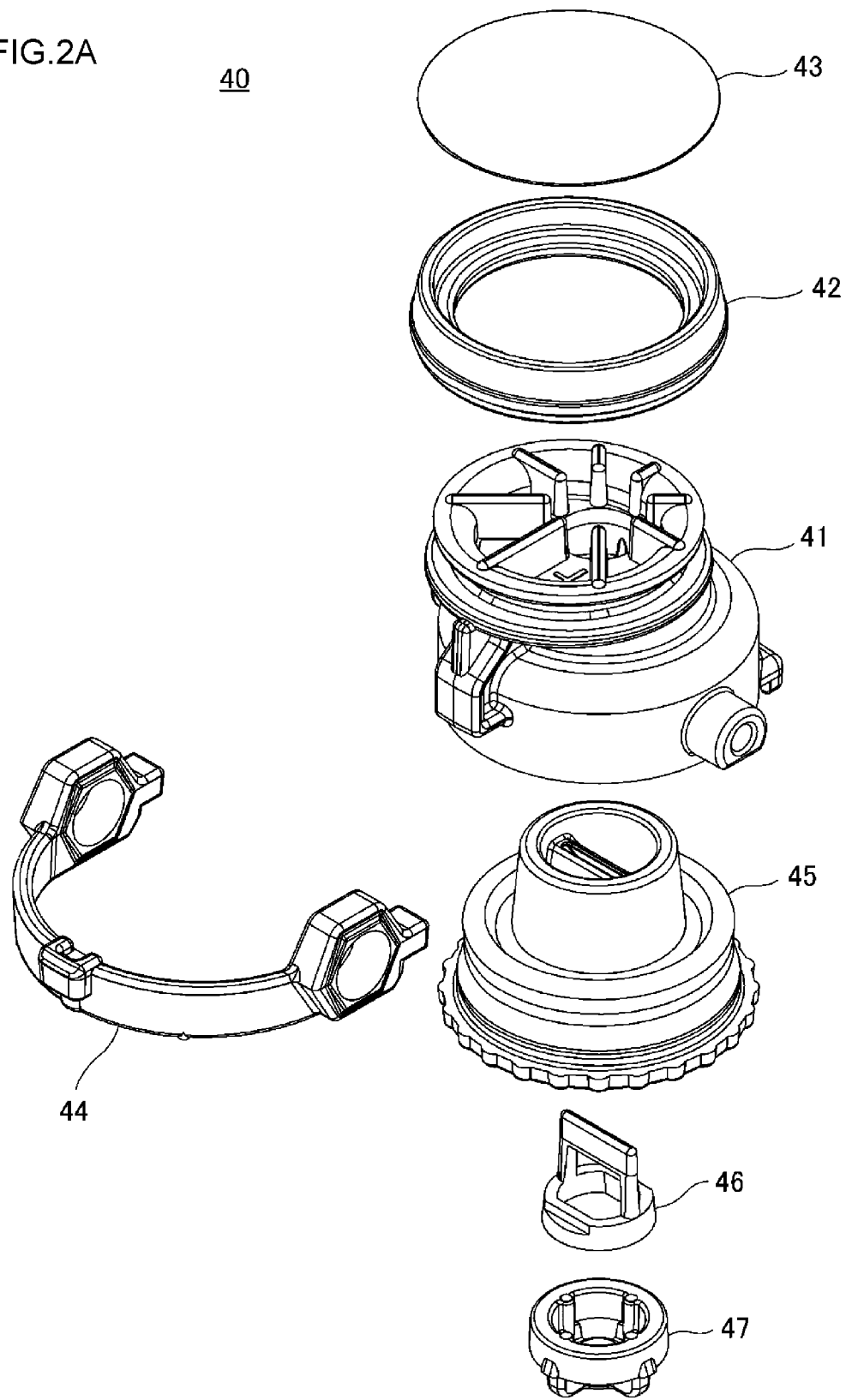
FIG. 2A is an exploded perspective view of a gas supply valve unit.

In general, according to one embodiment, a substrate storage container includes a container body configured to store substrates, a lid that closes an opening of the container body, and a valve unit that controls the flow of gas to the container body. The valve unit includes an elastic valve having a valve opening that connects a first passage communicating with the outside of the container body to a second passage communicating with the inside of the container body, a holding member that holds the elastic valve, and a clamping cap that is inserted in the elastic valve and secures the elastic valve to the holding member. The valve opening is tightly closed by the elastic force of the elastic valve.

In some embodiments, when a positive pressure is applied to the first passage, the valve opening deforms to form a gap and allows the gas to flow to the container body. In other embodiments, when a positive pressure is applied to the second passage, the valve opening deforms to form a gap and allows the gas to flow to the container body. In these embodiments, the valve unit has a filter that filters the gas, and the holding member holds the filter.

In the following, exemplary embodiments will be described in detail with reference to the accompanying drawings. Note that like parts are designated by like reference numerals or characters throughout the description of the embodiments.

FIG. 1 is an exploded perspective view of a substrate storage container 1 according to an embodiment. As illustrated in FIG. 1, the substrate storage container 1 includes a container body 10 configured to store substrates W, a lid 20 that closes an opening 11 of the container body 10, and an annular gasket 30 that is located between the container body 10 and the lid 20.

The container body 10 has a shape of a box with the opening 11 in the front. The area around the opening 11 is bent or stepped such that it spreads outward with steps. A step formed on the front side in the inner periphery of the opening 11 has a surface that serves as a sealing surface 12 to be in contact with the gasket 30. The container body 10 is preferably of a front-open type so that substrates W with a diameter of 300 mm or 450 mm can be easily placed.

The container body 10 is provided with supports 13 on the left and right sides of its interior. The supports 13 have the function of positioning and holding substrates W. The supports 13 each include a plurality of grooves formed in the height direction, which constitute a serrated surface. Each substrate W is placed with the support of a pair of left and right grooves at the same height. The supports 13 may be made of the same material as that of the container body 10, or it may be made of a different material to enhance washability and sliding properties.

The container body 10 is also provided with a rear retainer (not illustrated) on the rear (far) side of the interior. The rear retainer is paired with a front retainer (described later) to retain or hold substrates W when the container body 10 is closed with the lid 20. The container body 10, however, need not necessarily have such a rear retainer as in this embodiment. Instead, the supports 13 may have a substrate holding portion in, for example, a "<" or straight shape on the far side of the serrated surface to hold substrates W with the front retainer and the substrate holding portion. The supports 13 and the rear retainer may be provided to the container body 10 by insert molding, fitting, or the like.

Substrates W are supported by the supports 13 while they are stored in the container body 10. An example of substrates W may be, but is not limited to, silicon wafers. For example, substrates W may be quartz wafers, gallium arsenide wafers, or the like.

The container body 10 has a robotic flange 14, which is detachably provided in the center of its ceiling. In a factory, a transport robot grips the robotic flange 14 to transport the substrate storage container 1, which stores substrates W airtightly in a clean condition, to each processing equipment that performs a process for processing substrates W.

The container body 10 further has manual handles 15 to be held by an operator, which are removably attached to the center of the outer surface on both sides.

In addition, the container body 10 includes a supply port 16 and an exhaust port 17 in the bottom surface of the interior. The container body 10 further includes valve units 40 and 50 (described later), which are attached to the bottom surface of the exterior. An inert gas such as nitrogen gas or dry air is supplied from the supply port 16 into the substrate storage container 1, which is closed by the lid 20, and is discharged from the exhaust port 17 as necessary to replace gas in the substrate storage container 1, to maintain the airtight condition with low humidity, or to blow off impurities on substrates W to thereby keep the inside of the substrate storage container 1 clean. Incidentally, there may be a case where the exhaust port 17 is connected to a negative pressure (vacuum) generator to forcibly discharge gas from the exhaust port 17 in addition to supplying gas from the supply port 16.

By detecting gas discharged from the exhaust port 17, it can be checked whether the gas in the substrate storage container 1 has been replaced with the gas supplied thereto.

Although the supply port 16 and the exhaust port 17 are preferably located outside a position where substrates W are projected onto the bottom surface, the number and location of them are not limited to those illustrated in the drawings, and they may be located at the four corners of the bottom surface of the container body 10. Alternatively, the lid 20 may be provided with the supply port 16 and the exhaust port 17.

The lid 20 has a substantially rectangular shape and is attached to the front of the opening 11 of the container body 10. The lid 20 has a locking mechanism (not illustrated) with an engagement claw, which fits in an engagement hole (not illustrated) formed in the container body 10 to thereby lock the lid 20.

The lid 20 has an elastic front retainer (not illustrated), which is removably attached to the central portion by fitting or integrally formed in the central portion by insert molding, for horizontally holding the front periphery of substrates W. The front retainer is a part that comes into direct contact with wafers as with the serrated surface and the substrate holding portion of the supports 13. Therefore, the front retainer is made of a material with good washability and sliding properties.

The lid 20 also has an attachment groove 21 to which the gasket 30 is attached. For example, an annular convex portion 22, which is smaller than the step around the opening 11, may be formed in the surface of the lid 20 on the container body 10 side to form the attachment groove 21 annularly with a substantially U-shaped cross-section. The convex portion 22 is inserted beyond the step around the opening 11 when the lid 20 is attached to the container body 10.

Examples of materials for the container body 10 and the lid 20 include thermoplastic resins such as polycarbonate, cycloolefin polymer, polyetheretherketone, and liquid crystal polymer. A conductive agent made of conductive carbon, conductive fibers, metal fibers, conductive polymers, or the like, various antistatic agents, ultraviolet absorbers, and the like may be added to the thermoplastic resins as appropriate.

The gasket 30 has an annular shape corresponding to the front shape of the lid 20 (and the shape of the opening 11 of the container body 10), and specifically, it has a rectangular frame shape in this embodiment. However, the annular gasket 30 may be in a circular ring shape before being attached to the lid 20.

The gasket 30 is located between the sealing surface 12 of the container body 10 and the lid 20. When the lid 20 is attached to the container body 10, the gasket 30 adheres closely to the sealing surface 12 and the lid 20. The gasket 30 thereby ensures the airtightness of the substrate storage container 1 while preventing dust, moisture, and the like from entering the substrate storage container 1 from the outside as well as reducing gas leakage from the inside to the outside.

Examples of materials for the gasket 30 include thermoplastic elastomers such as polyester elastomers, polyolefin elastomers, fluoroelastomers, and urethane elastomers, and elastic materials such as fluorine rubbers, ethylene propylene rubbers, and silicone rubbers. Various additives may be added to the materials as appropriate to impart other properties or functions thereto.

Figure 2B:
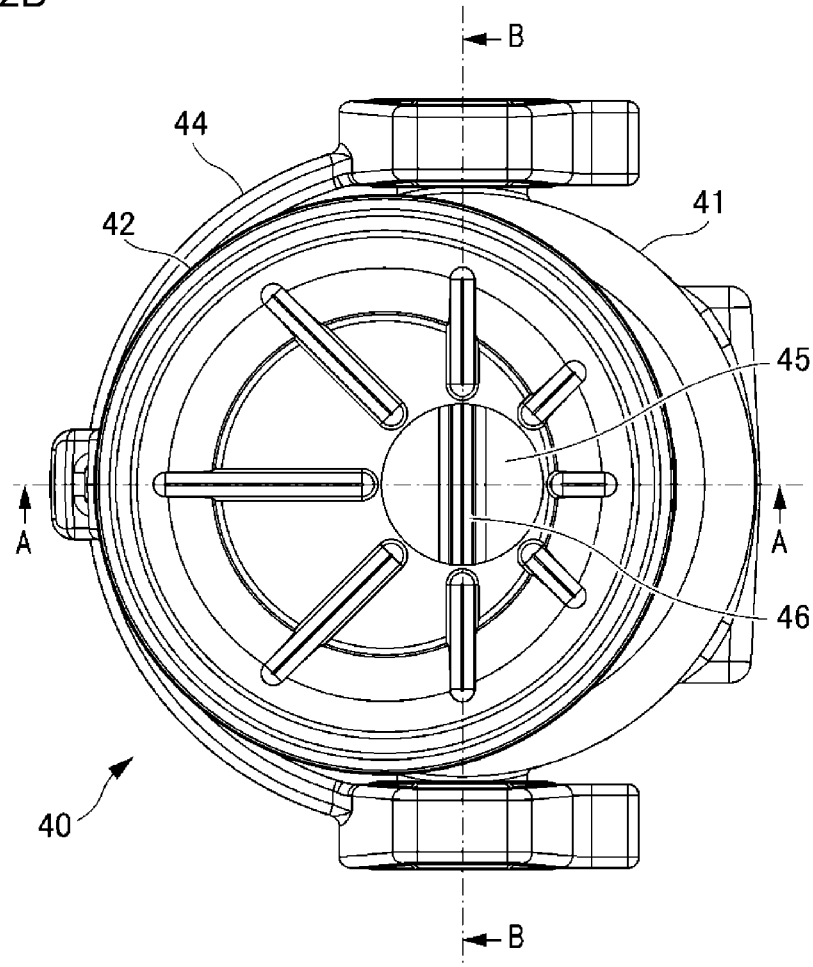
FIG. 2B is a top view of the gas supply valve unit.
Figure 2C:
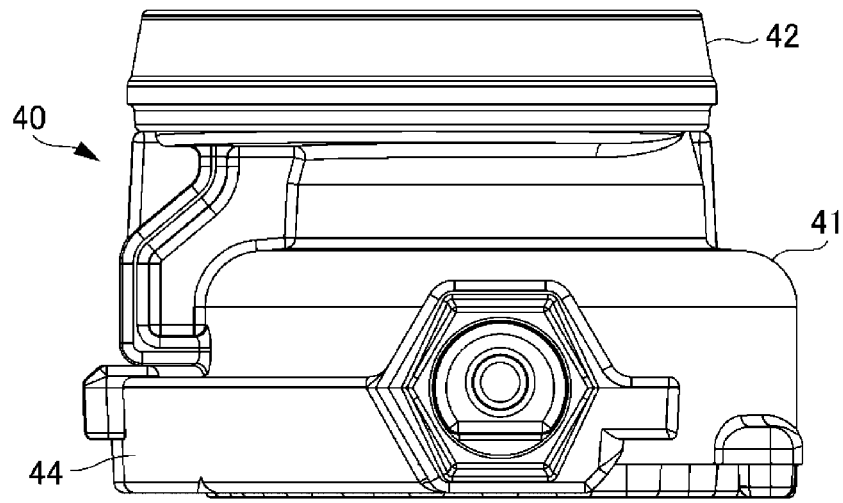
FIG. 2C is a front view of the gas supply valve unit.
Figure 2D:
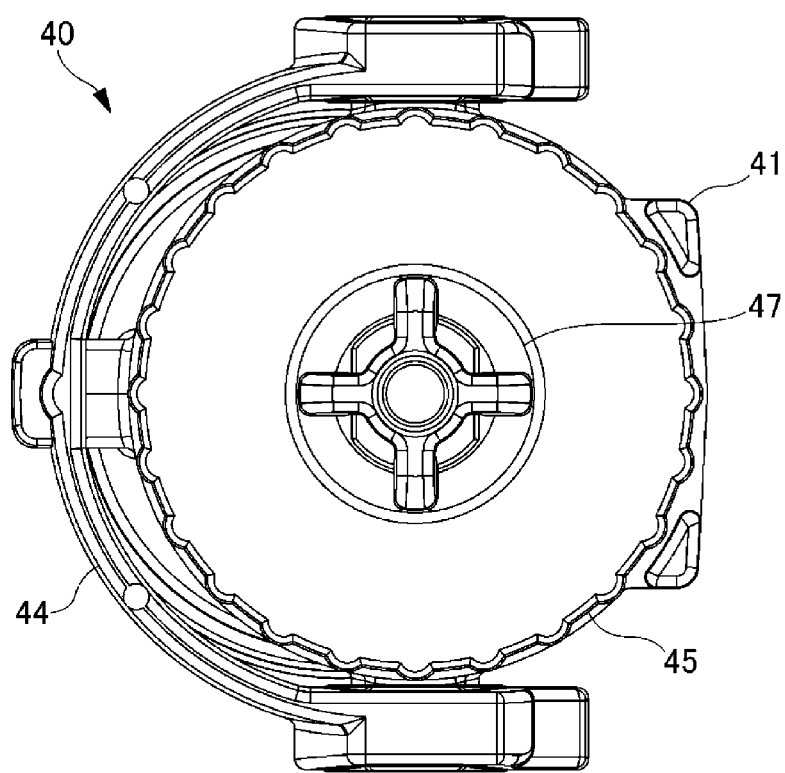
FIG. 2D is a bottom view of the gas supply valve unit.
Figure 2E:
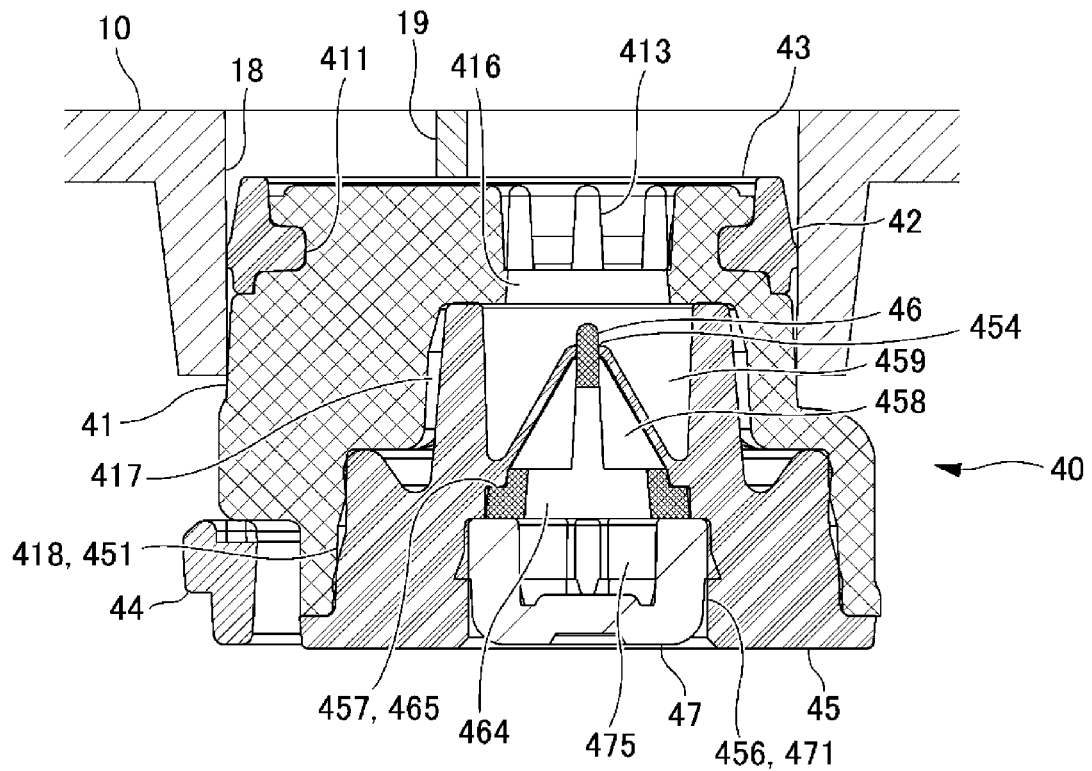
FIG. 2E is a cross-sectional view of the gas supply valve unit taken along line A-A in FIG. 2B.
Figure 2F:
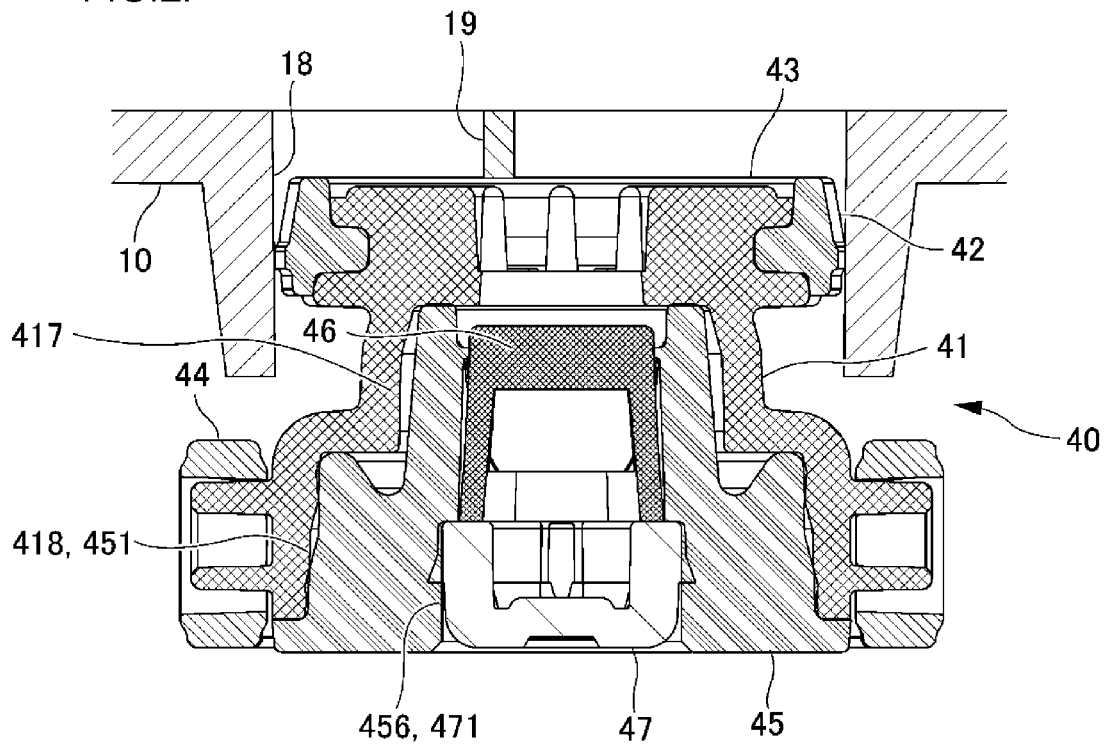
FIG. 2F is a cross-sectional view of the gas supply valve unit taken along line B-B in FIG. 2B.

Next, the gas supply valve unit 40 will be described. FIGS. 2A to 2F illustrate the gas supply valve unit 40: FIG. 2A is an exploded perspective view, FIG. 2B is a top view, FIG. 2C is a front view, FIG. 2D is a bottom view, FIG. 2E is a cross-sectional view taken along line A-A in FIG. 2B, and FIG. 2F is a cross-sectional view taken along line B-B in FIG. 2B. FIGS. 2E and 2F also illustrate the bottom surface of the container body 10.

The valve unit 40 is configured to control the flow of gas to the container body 10. When attached to the container body 10, the valve unit 40 communicates with the supply port 16 through a gas flow passage (not illustrated). As illustrated in FIGS. 2E and 2F, the valve unit 40 includes a holding member 41 that is fitted in a through hole 18 formed by a rib in the bottom surface of the container body 10 (or a bottom plate attached to the bottom surface of the container body 10). A plurality of ventilation ribs 19 are formed on the base end side of the through hole 18 to ensure the flow of gas to the container body 10.

Figure 3A:
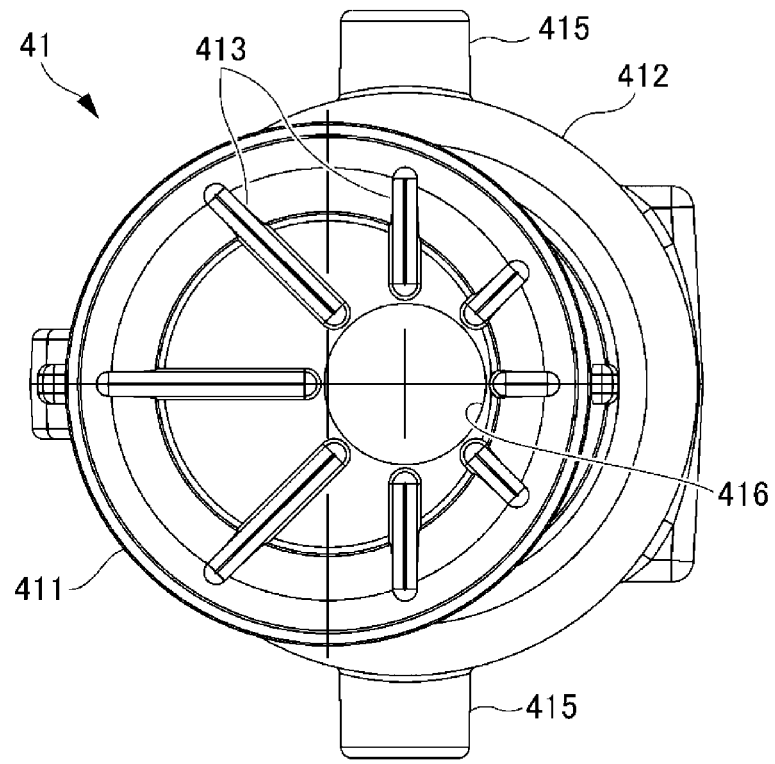
FIG. 3A is a top view of a holding member of the valve unit.
Figure 3B:
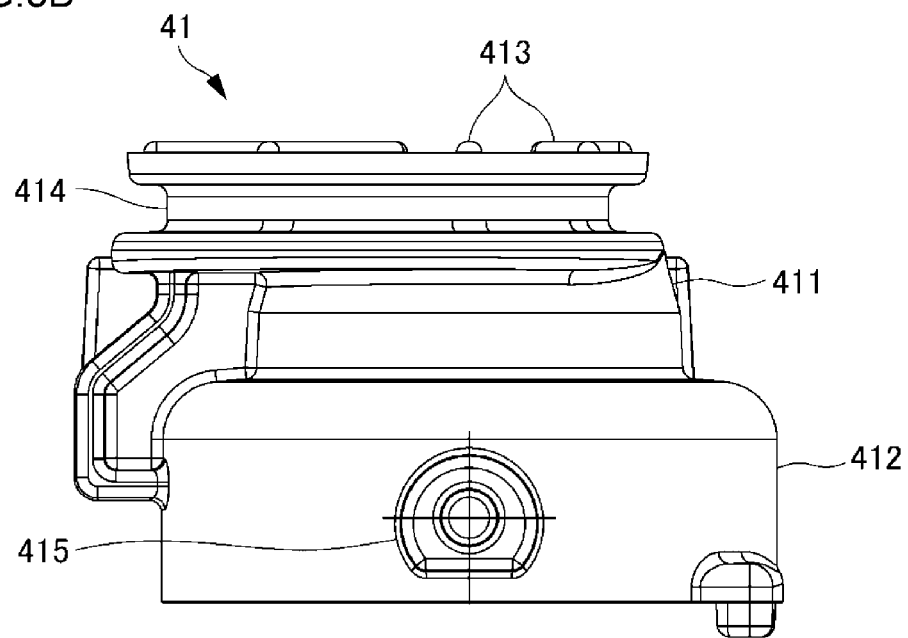
FIG. 3B is a front view of the holding member of the valve unit.
Figure 3C:
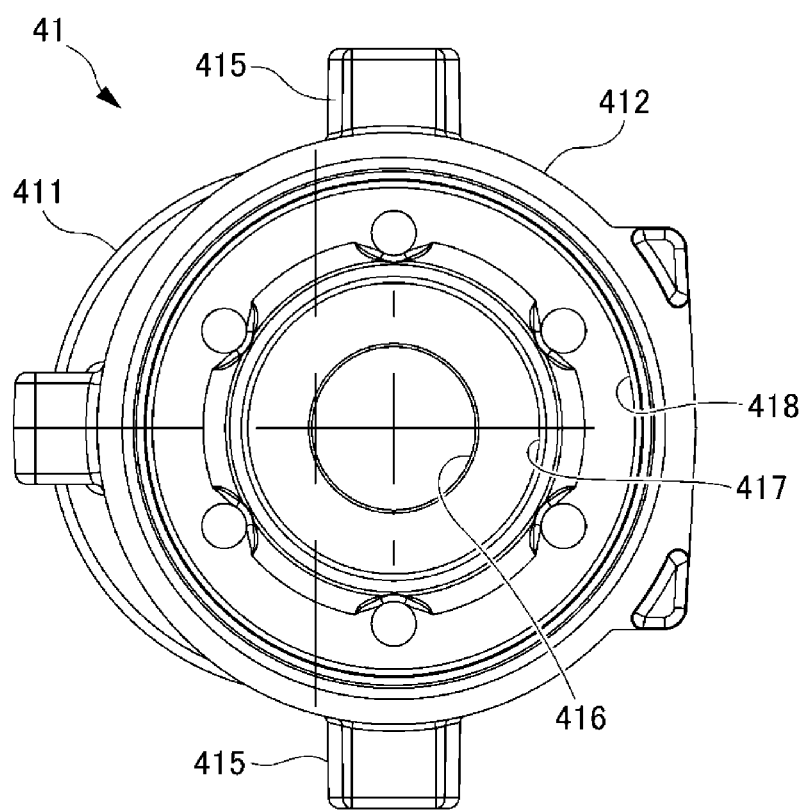
FIG. 3C is a bottom view of the holding member of the valve unit.
Figure 3D:
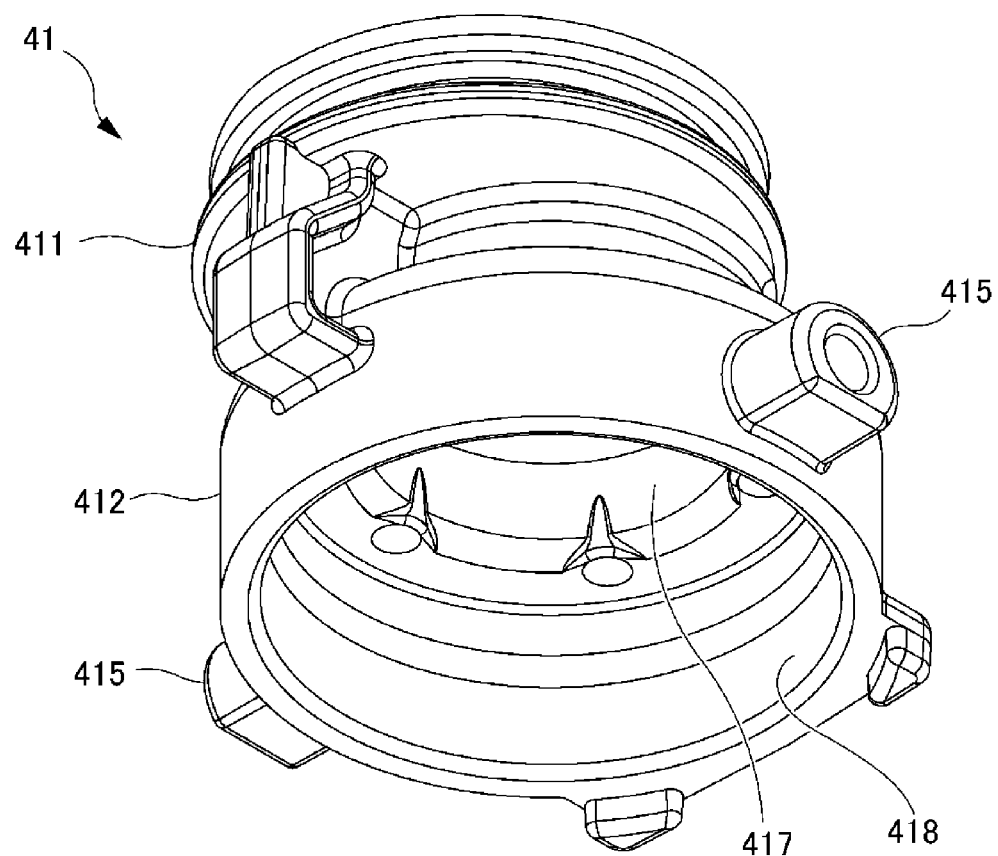
FIG. 3D is a perspective view of the holding member of the valve unit.

FIGS. 3A to 3D illustrate the holding member 41 of the valve unit 40: FIG. 3A is a top view, FIG. 3B is a front view, FIG. 3C is a bottom view, and FIG. 3D is a perspective view.

The holding member 41 includes a first cylindrical portion 411 and a second cylindrical portion 412. The first cylindrical portion 411 and the second cylindrical portion 412 are not concentric, and their central axes are offset from each other (see FIGS. 3A and 3C).

The first cylindrical portion 411 has a ring groove 414 formed in its outer peripheral surface. The first cylindrical portion 411 also has partition ribs 413, which extend radially from a ventilation hole 416, on the upper surface on the container body 10 side. The ventilation hole 416 is formed in the first cylindrical portion 411 such that its central axis coincides with the central axis of the second cylindrical portion 412.

In addition, the first cylindrical portion 411 is provided with a housing hole 417 that communicates with the ventilation hole 416 (see FIGS. 3C and 3D). The housing hole 417 has an inner diameter larger than the inner diameter of the ventilation hole 416.

The second cylindrical portion 412 has a pair of support shafts 415 protruding from its outer peripheral surface along a direction substantially perpendicular to the offset direction. The support shafts 415 are chamfered at the bottom (see FIG. 3B).

The second cylindrical portion 412 also has a fitting hole 418 formed in the center (see FIGS. 3C and 3D). The fitting hole 418 has an inner diameter larger than the inner diameter of the housing hole 417. The inner diameter of the fitting hole 418 is equal to or slightly smaller than the outer diameter of a fitting trunk portion 451 of an elastic valve 45 (described later).

The holding member 41 is made of a thermoplastic resin such as, for example, polycarbonate, polyetherimide, polyetheretherketone, liquid crystal polymer, or the like.

The valve unit 40 also includes an annular seal ring 42, which is attached to the ring groove 414 of the holding member 41 (see FIGS. 2A, 2E and 2F). The seal ring 42 ensures the airtightness between the holding member 41 and the through hole 18 of the container body 10 when the holding member 41 is inserted in the through hole 18. The seal ring 42 is fitted in the through hole 18 and thereby has a function to secure the holding member 41.

The seal ring 42 is made of a material such as, for example, fluorine rubber, natural rubber, urethane rubber, ethylene propylene rubber, or the like.

The valve unit 40 also includes one or more filters 43, which are provided at the upper end of (the partition ribs 413 of) the first cylindrical portion 411 of the holding member 41 by, for example, adhesion or welding (see FIG. 2A). The filter(s) 43 filters gas to be supplied or discharged. Examples of the filter(s) 43 include porous membranes made of tetrafluoroethylene, polyester fiber, fluororesin, or the like, molecular filtration filters made of glass fiber or the like, and chemical filters made of a filter medium such as activated carbon fiber carrying a chemical adsorbent.

When a plurality of filters 43 are used, they may be of the same type. However, a combination of filters with different properties is more desirable because it can prevent contamination with organic substances as well as particles. For example, to achieve the function of suppressing the passage or retention of liquid such as water or cleaning solution during the cleaning of the container body 10, one of the filters 43 may be made of a hydrophobic or hydrophilic material to regulate the permeation of liquid.

Figure 4A:
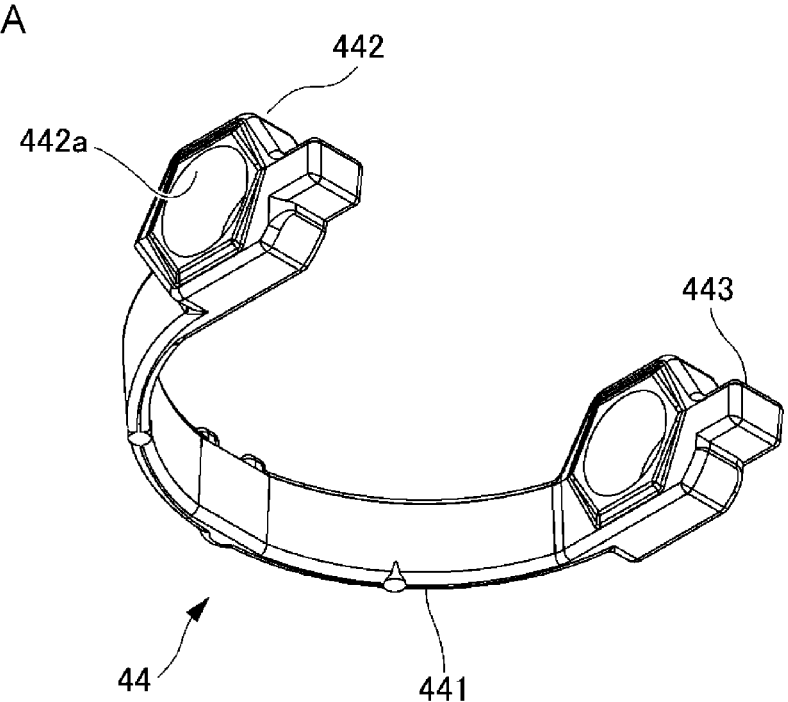
FIG. 4A is a perspective view of a handle of the valve unit.
Figure 4B:
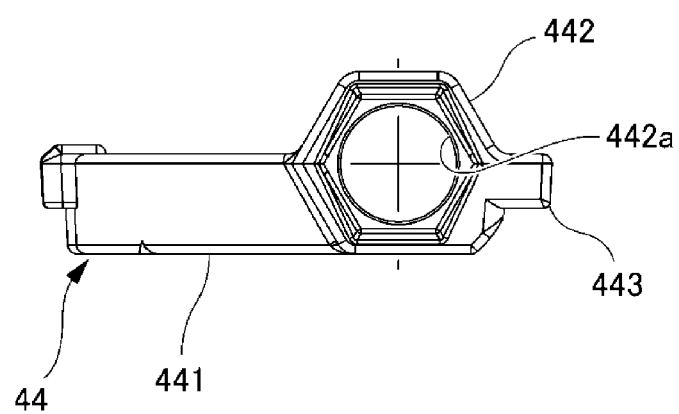
FIG. 4B is a side view of the handle of the valve unit.

FIGS. 4A and 4B illustrate a handle 44 of the valve unit 40: FIG. 4A is a perspective view, and FIG. 4B is a side view.

The handle 44 is formed in a U shape and includes an arcuate body portion 441 and bearings 442 provided at both ends of the body portion 441. The bearings 442 each have a shaft hole 442a into which a corresponding one of the support shafts 415 of the holding member 41 is inserted (see FIG. 2A).

Each of the bearings 442 also has a protruding piece 443 on the side opposite to the side that is connected to the body portion 441. The protruding piece 443 is used on the occasion of attaching the valve unit 40 to the container body 10. When the handle 44 is rotated to be retracted as illustrated in FIG. 2C, the valve unit 40 is fitted into the through hole 18 on the principle of leverage with the mounting portion of the container body 10 as a fulcrum. More details can be found in Japanese patent publication No. 2014-160783, which is incorporated herein by reference.

The handle 44 is made of a thermoplastic resin such as, for example, polycarbonate, polyetherimide, polyetheretherketone, liquid crystal polymer, or the like.

Figure 5A:
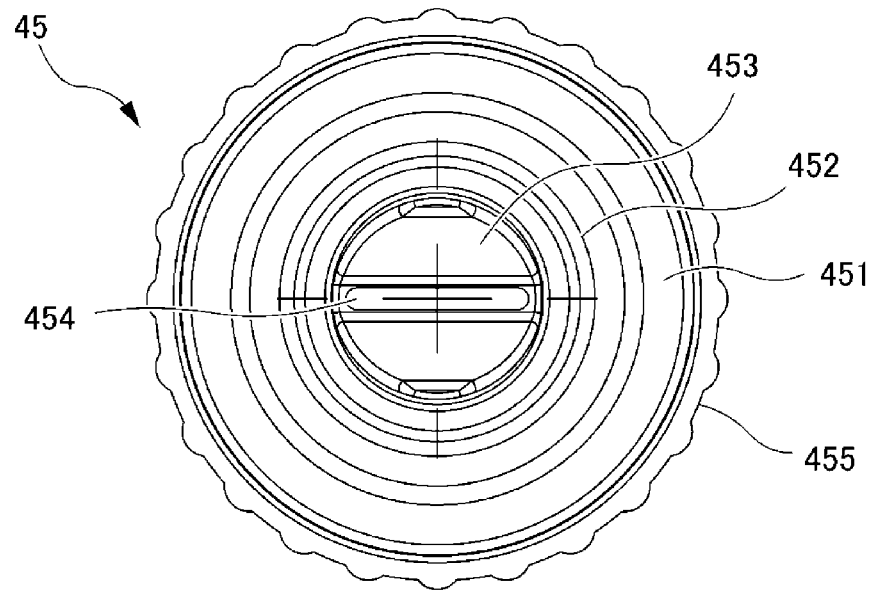
FIG. 5A is a top view of an elastic valve of the valve unit.
Figure 5B:
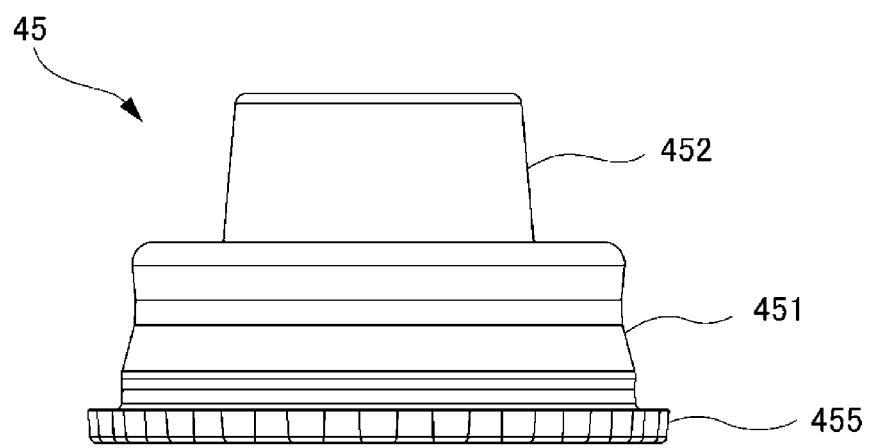
FIG. 5B is a front view of the elastic valve of the valve unit.
Figure 5C:
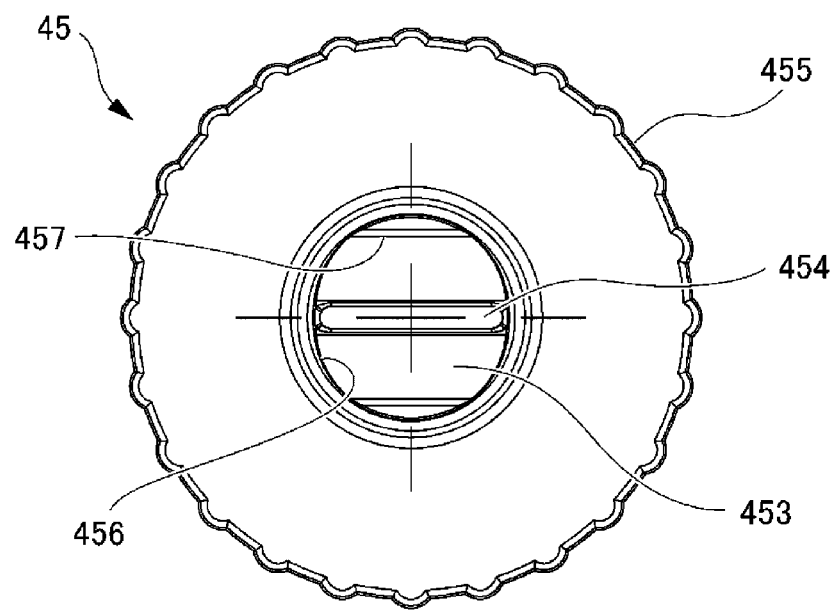
FIG. 5C is a bottom view of the elastic valve of the valve unit.
Figure 5D:
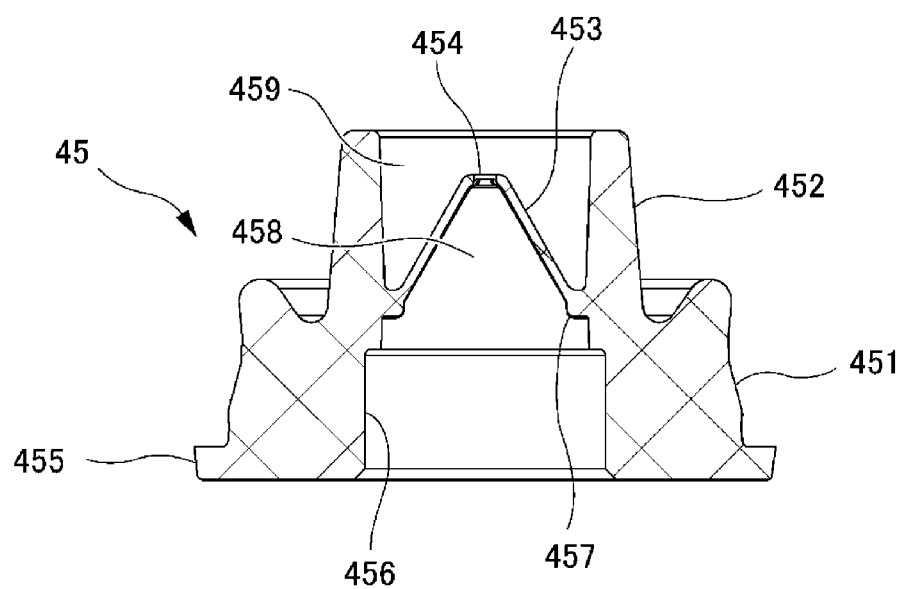
FIG. 5D is a cross-sectional view of the elastic valve of the valve unit.

FIGS. 5A to 5D illustrate the elastic valve 45 of the valve unit 40: FIG. 5A is a top view, FIG. 5B is a front view, FIG. 5C is a bottom view, and FIG. 5D is a cross-sectional view.

The elastic valve 45 has the cylindrical fitting trunk portion 451 and a cylindrical portion 452 extending from the recessed upper surface of the fitting trunk portion 451, which are concentric to each other. The fitting trunk portion 451 has an outer diameter equal to or slightly larger than the inner diameter of the fitting hole 418 of the holding member 41 and is provided with a flange 455 at the lower end. Preferably, the fitting trunk portion 451 is fitted in the fitting hole 418 in a press-fit (interference fit) state.

The cylindrical portion 452 includes a valve portion 453 having a valve opening 454 on its inner peripheral surface (see FIG. 5D). The valve portion 453 is formed in a beak shape with two inclined surfaces extending toward the valve opening 454 at the tip such that its cross-section has a mountain shape toward the container body 10 side. Incidentally, the ridgeline of the mountain shape need not necessarily be straight as in the embodiment, and it may be curved or arc-shaped.

The valve portion 453 divides the inner space of the cylindrical portion 452 into a first passage 458 communicating with the outside of the container body 10 and a second passage 459 communicating with the inside of the container body 10. The first passage 458 and the second passage 459 communicate with each other through the valve opening 454.

The valve opening 454 is formed in the shape of an oval or elliptical slit. The valve opening 454 may be formed at the same time as molding with a mold or cut by a cutter or the like after molding. Although depending on the thickness of the elastic valve 45, the minor axis of the valve opening 454 may have a length of, for example, about 0.1 mm or more and 2.0 mm or less.

Inside the fitting trunk portion 451, a cylindrical ventilation opening 456 is formed so as to communicate with the first passage 458. A clamping cap 47 (described later) can be inserted in the ventilation opening 456. A positioning protrusion 457 for positioning a valve plug 46 (described later) is formed on the far side of the ventilation opening 456 (at the connection with the valve portion 453).

The elastic valve 45 may be made with various rubbers, thermoplastic elastomer resins, or the like. Examples of materials include rubbers such as fluororubber and ethylene propylene rubber, thermoplastic elastomers such as polyester elastomers, polyolefin elastomers, fluoroelastomers, and urethane elastomers, and the like.

Figure 6A:
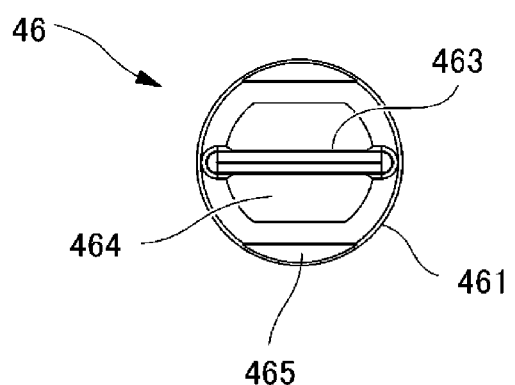
FIG. 6A is a top view of a valve plug of the valve unit.
Figure 6B:
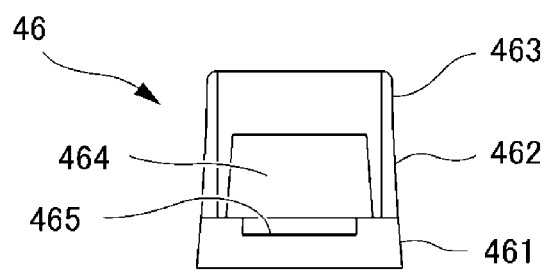
FIG. 6B is a front view of the valve plug of the valve unit.
Figure 6C:
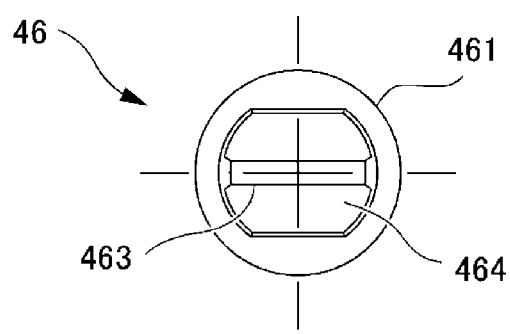
FIG. 6C is a bottom view of the valve plug of the valve unit.
Figure 6D:
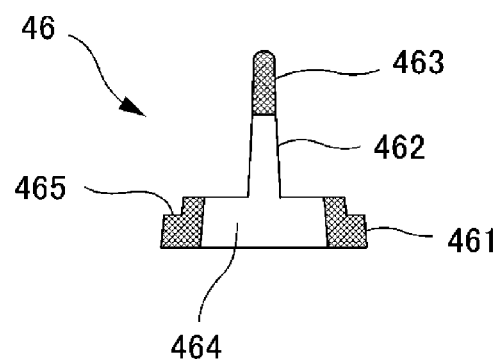
FIG. 6D is a side view of the valve plug of the valve unit.

FIGS. 6A to 6D illustrate the valve plug 46 of the valve unit 40: FIG. 6A is a top view, FIG. 6B is a front view, FIG. 6C is a bottom view, and FIG. 6D is a side view.

The valve plug 46 includes a ring-shaped base portion 461, two leg portions 462 erected from the base portion 461, and a seal plate 463 that bridges the two leg portions 462. The base portion 461 has two chamfered portions 465 on the upper surface where the leg portions 462 are erected so as to engage the positioning protrusion 457 of the elastic valve 45 (see FIG. 2E).

The seal plate 463 has a cross-sectional shape that is the same as or similar to the shape of the valve opening 454. That is, the major axis of the seal plate 463 has a length equal to the major axis of the oval or elliptical shape of the valve opening 454 or a length longer than it by 1 mm or less. In other words, the seal plate 463 has a circumference equal to or slightly longer than the circumference of the valve opening 454.

A circular opening inside the base portion 461 and a space between the two leg portions 462 provide an opening 464 that gas can pass through.

The valve plug 46 is made of a material that does not stick easily to the material of the elastic valve 45, such as, for example, cycloolefin polymer, polyetheretherketone, polyolefin methacrylate, polypropylene, polybutylene terephthalate, and polycarbonate.

Figure 7A:
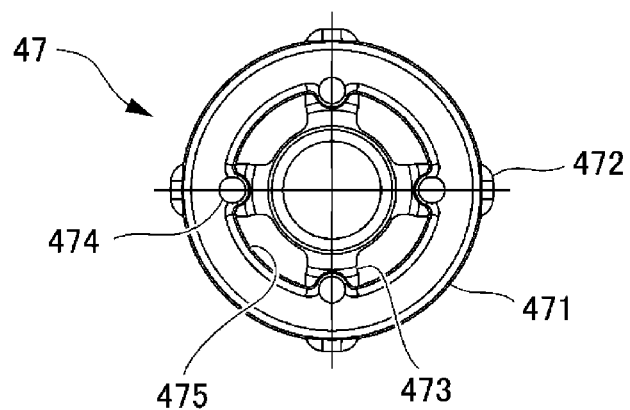
FIG. 7A is a top view of a cap of the valve unit.
Figure 7B:
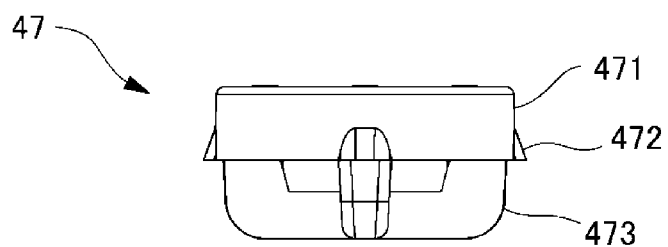
FIG. 7B is a front view of the cap of the valve unit.
Figure 7C:
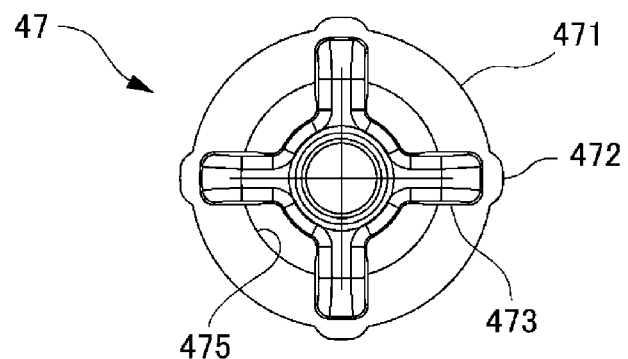
FIG. 7C is a bottom view of the cap of the valve unit.
Figure 7D:
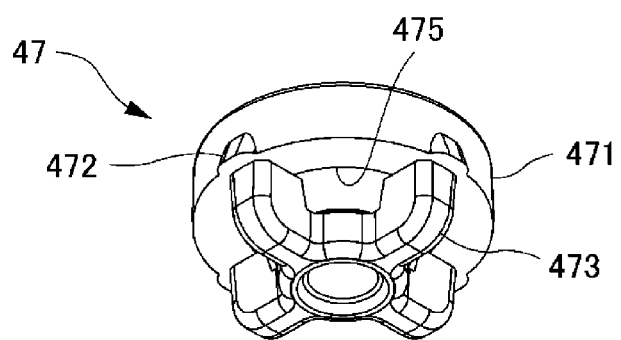
FIG. 7D is a perspective view of the cap of the valve unit.

FIGS. 7A to 7D illustrate the clamping cap 47 of the valve unit 40: FIG. 7A is a top view, FIG. 7B is a front view, FIG. 7C is a bottom view, and FIG. 7D is a perspective view.

The clamping cap 47 is inserted in the ventilation opening 456 of the elastic valve 45 (see FIGS. 2A, 2E and 2F). The clamping cap 47 includes an annular portion 471 and a plurality of (e.g., four) leg portions 473 extending in an L-shape from one surface of the annular portion 471 toward the center. The four leg portions 473 are connected to one another to form a cross shape.

The annular portion 471 is provided with a plurality of (e.g., four) reinforcing ribs 474 on its inner peripheral surface and four locking claws 472 on its outer peripheral surface. The annular portion 471 has an outer diameter equal to or slightly larger than the inner diameter of the ventilation opening 456 of the elastic valve 45.

The locking claws 472 are engaged or locked at the ventilation opening 456 of the elastic valve 45. The locking claws 472 push out the fitting trunk portion 451 surrounding the ventilation opening 456 and thereby have the function of retaining the elastic valve 45 in close contact with the fitting hole 418 of the holding member 41 (see FIGS. 2E and 2F). Note that the clamping cap 47 may not be used if the tightness of fit between the fitting hole 418 of the holding member 41 and the fitting trunk portion 451 of the elastic valve 45 can be sufficiently high.

The clamping cap 47 is made of a thermoplastic resin such as, for example, polycarbonate, polyetherimide, polyetheretherketone, liquid crystal polymer, or the like.

Figure 8A:
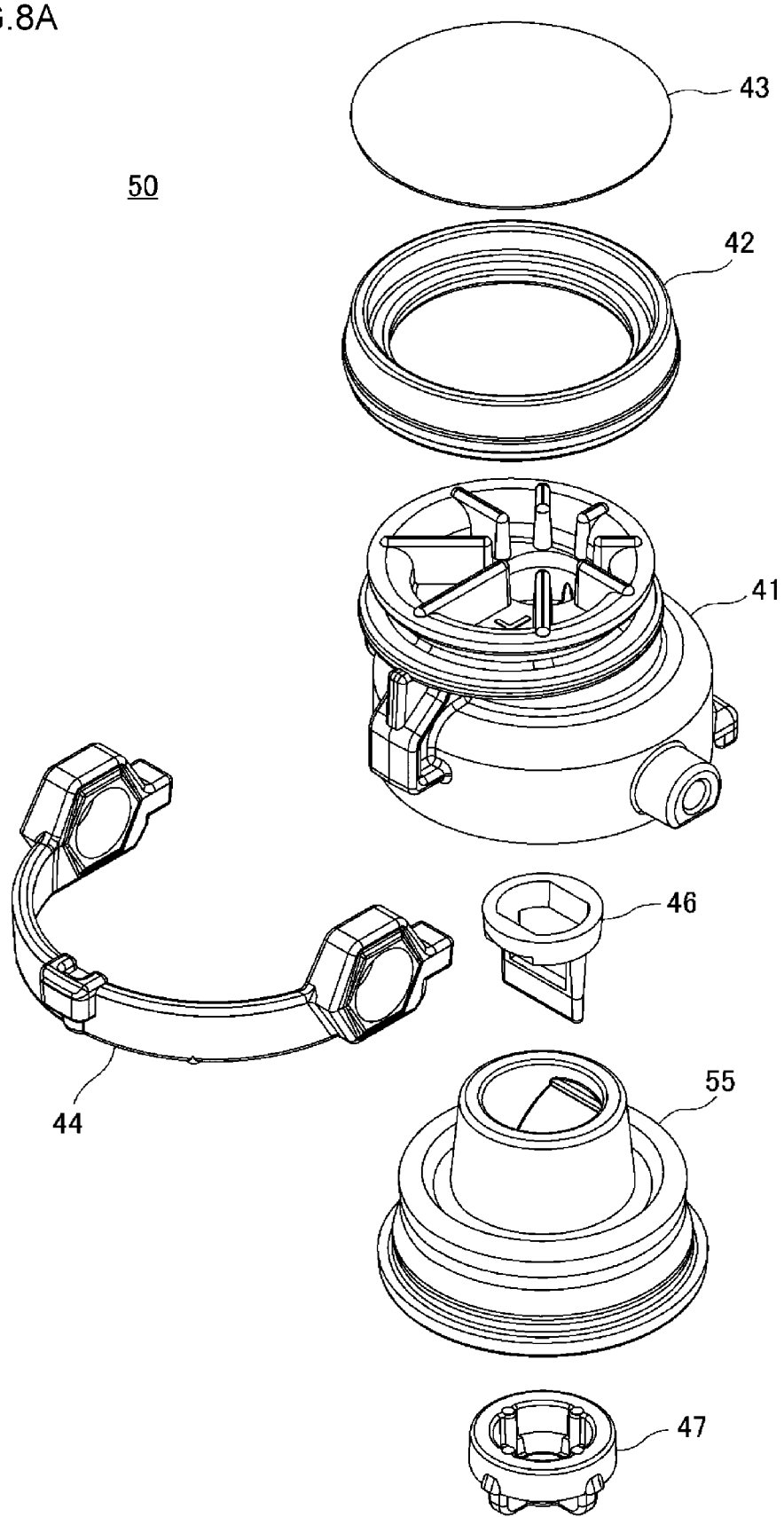
FIG. 8A is an exploded perspective view of an exhaust valve unit.
Figure 8B:
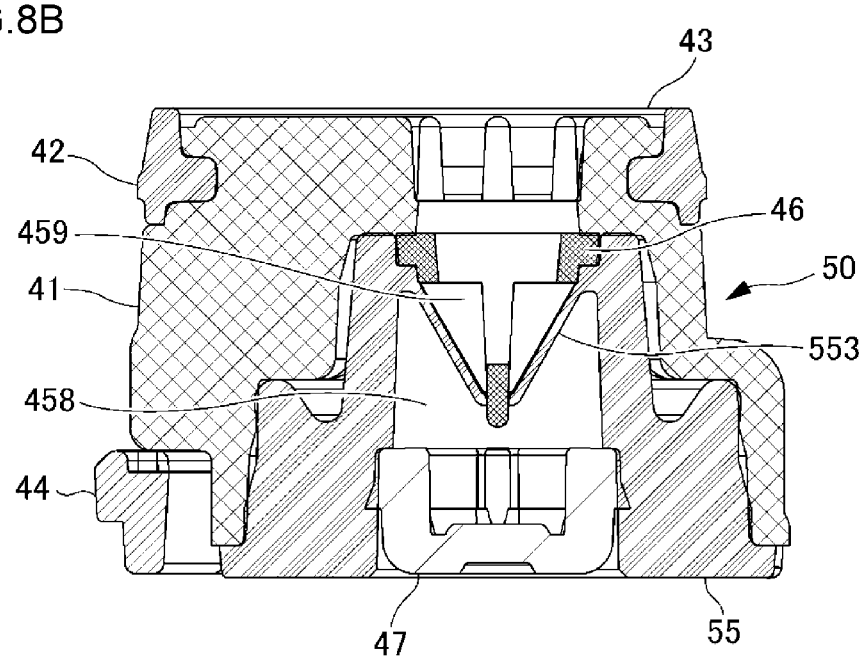
FIG. 8B is a cross-sectional view of the exhaust valve unit taken along line A-A in FIG. 2B.
Figure 8C:
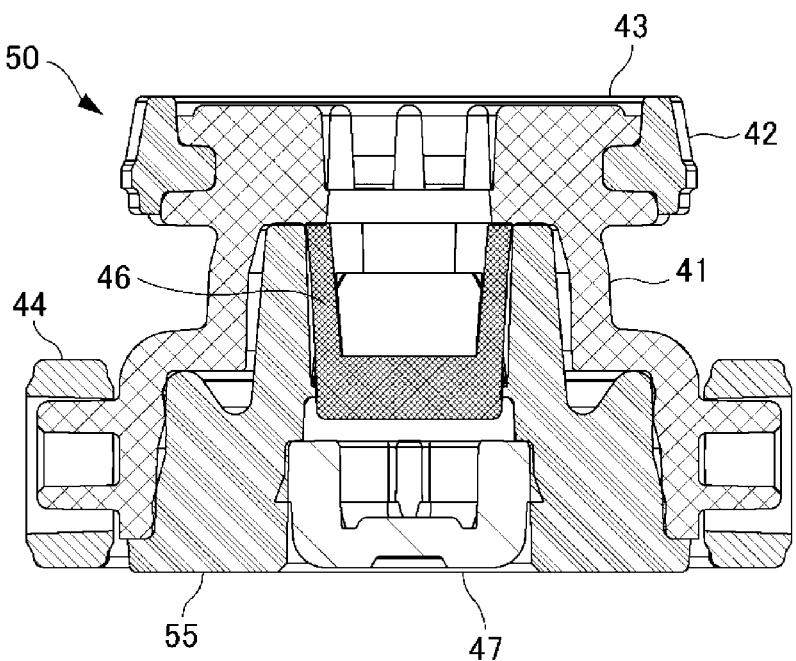
FIG. 8C is a cross-sectional view of the exhaust valve unit taken along line B-B in FIG. 2B.

Next, the exhaust valve unit 50 will be described. Since the exhaust valve unit 50 is formed of basically the same parts as the gas supply valve unit 40 except for the elastic valve 45, the description of each part will be omitted as appropriate. FIG. 8 illustrate the exhaust valve unit 50: FIG. 8A is an exploded perspective view, FIG. 8B is a cross-sectional view taken along line A-A in FIG. 2B, and FIG. 8C is a cross-sectional view taken along line B-B in FIG. 2B.

The valve unit 50 is configured to control the flow of gas to the container body 10. When attached to the container body 10, the valve unit 50 communicates with the exhaust port 17 through a gas flow passage (not illustrated). In contrast to the valve unit 40, the valve unit 50 is used for the exhaust port 17 that allows the exhaust of gas from the container body 10 to the outside while preventing the supply of gas to the inside of the container body 10.

In the valve unit 50, a valve portion 553 of an elastic valve 55 is formed in a valley shape with respect to the container body 10 side. The valve plug 46 is held between the holding member 41 and the elastic valve 55.

Described below is how the valve unit 40 controls the flow of gas.

When a positive pressure is applied to neither the first passage 458 nor the second passage 459 of the elastic valve 45, the valve opening 454 is sealed with the valve plug 46, and the valve unit 40 blocks the flow of gas to both sides. When a positive pressure is applied to the second passage 459, the two inclined surfaces of the valve portion 453 are pressed toward the valve plug 46. Even if different pressures are applied to the respective inclined surfaces, the valve opening 454 is not distorted because of the valve plug 46 interposed in the center, and the flow of gas is blocked to both sides.

When, for example, a positive pressure of a predetermined value or higher is applied to the first passage 458, the elastic valve 45 deforms so as to expand the valve opening 454 according to the magnitude of the positive pressure, thereby forming a gap with the valve plug 46. Gas supplied from the outside of the container body 10 passes through this gap, flows to the second passage 459, and is supplied to the inside of the container body 10.

Meanwhile, when a negative pressure of a predetermined value or higher is applied to the second passage 459, the valve unit 40 performs a similar valve opening operation since this is relatively similar to the case where a positive pressure of a predetermined value or higher is applied to the first passage 458.

On the other hand, when a positive pressure is applied to the second passage 459, the valve portion 453 of the elastic valve 45 bends downward in the opposite direction as it has a tapered shape toward the apex (apex line) and deforms so as to close the valve opening 454, thus coming into close contact with the valve plug 46. When the valve opening 454 is sealed with the valve plug 46, the flow of gas from the second passage 459 side is blocked, and the gas cannot flow to the first passage 458 side.

When a negative pressure of a predetermined value or higher is applied to the first passage 458, the valve unit 40 operates in the same manner since this is relatively similar to the case where a positive pressure of a predetermined value or higher is applied to the second passage 459.

The predetermined value of the pressure that allows a gas flow can be adjusted by changing the material, hardness, shape/dimensions, and thickness of the elastic valve 45, and the width or length of the valve opening 454 and the valve plug 46 (the seal plate 463 thereof).

The valve unit 50 controls the flow of gas in the opposite direction but basically in the same manner as the valve unit 40, and therefore the description thereof will be omitted.

As described above, according to the embodiment, the substrate storage container 1 includes the container body 10 configured to store substrates W, the lid 20 that closes the opening 11 of the container body 10, and the valve unit 40 (50) that controls the flow of gas to the container body 10. The valve unit 40 (50) includes the elastic valve 45 (55) having the valve opening 454 that connects the first passage 458 communicating with the outside of the container body 10 to the second passage 459 communicating with the inside of the container body 10, the holding member 41 that holds the elastic valve 45 (55), and the clamping cap 47 that is inserted in the elastic valve 45 (55) and thereby secures the elastic valve 45 (55) to the holding member 41. The valve opening 454 is tightly closed by the elastic force of the elastic valve 45 (55).

Thus, the elastic valve 45 (55) can be secured to the holding member 41 through the attachment of the clamping cap 47 to the elastic valve 45 (55). As a result, the number of parts can be reduced compared to conventional products. In addition, the tightness of fit between the holding member 41 and the elastic valve 45 can be increased, which prevents gas leakage from a gap between them.

Moreover, the substrate storage container 1 is provided with the valve unit 40 (50) that does not have metallic parts. Therefore, even if stored substrates W contain residual substances corrosive to metals, metal corrosion does not occur, and the valve unit 40 (50) is less likely to fail to operate.

Furthermore, simply by replacing the elastic valve 45 (55) and changing the position of the valve plug 46, gas can be circulated in either the supply or exhaust direction. Accordingly, regardless of the positions and numbers of the supply port 16 and the exhaust port 17, it is possible to deal with any gas supply and exhaust route.

According to the embodiment, the valve plug 46 is held between the elastic valve 55 and the holding member 41. With this, the valve plug 46 and the elastic valve 55 can be secured by inserting the clamping cap 47 in the elastic valve 55 and attaching it to the holding member 41.

According to the embodiment, the valve plug 46 is held between the elastic valve 45 and the clamping cap 47. With this, the valve plug 46 and the elastic valve 45 can be secured by attaching the clamping cap 47 to the elastic valve 45.

Incidentally, the opening 464 in the valve plug 46 and a ventilation opening 475 in the clamping cap 47 also correspond to the "first passage" recited in the claims in that they lead to the first passage 458. Similarly, the ventilation hole 416 also corresponds to the "second passage" recited in the claims in that it leads to the second passage 459.

According to the embodiment, when a positive pressure is applied to the first passage 458, the valve opening 454 deforms to form a gap, which allows a gas flow to the container body 10. Alternatively, when a positive pressure is applied to the second passage 459, the valve opening 454 deforms to form a gap, which allows a gas flow to the container body 10. Thus, for example, when gas is introduced from one of the valve units 40 and 50 to create a positive pressure and the pressure reaches a predetermined value, the valve opening 454 expands in the elastic valve 45, 55, and the introduced gas is supplied to the other one of the valve units 40 and 50.

According to the embodiment, the valve unit 40 (50) has the filter(s) 43 that filters gas, and the holding member 41 holds the filter(s) 43. Thereby, gas passing through the valve unit 40 (50) can be filtered. In addition, because of being held between the holding member 41 (the partition ribs 413 thereof) and the container body 10 (the ventilation ribs 19 thereof), the filter(s) 43 can be prevented from coming off.

While preferred embodiments of the invention have been described and illustrated, it is to be understood that the invention is not limited to the embodiments disclosed herein. Various changes, modifications, and alterations may be made within the scope of the invention as defined in the appended claims.

(Modification)

In the above embodiment, the first cylindrical portion 411 and the second cylindrical portion 412 of the holding member 41 are eccentric from each other to match the positioning relationship between an existing substrate storage container (1) and a load port equipped with gas supply/exhaust nozzles; however, they may be concentric as in the conventional valve unit disclosed in Japanese patent publication No. 2019-021736. Additionally, in the structure of the conventional valve unit, the valve plug 46 of the embodiment may be inserted in the slit of the elastic member (corresponding to the valve opening 454 of the elastic valve 45).

In some embodiments, the valve portion 453 of the elastic valve 45 may have a cross shape with two valve openings 454 formed perpendicular to each other. In this case, the seal plate 463 of the valve plug 46 may also be formed to have a cross-shaped cross-section.

In some embodiments, the valve unit 40 (50) may not be provided with the valve plug 46. In this case, the valve opening 454 of the elastic valve 45 (55) is formed such that it is normally closed by its own elasticity. When the elasticity of the valve is overcome as a positive pressure is applied to the first passage 458, the valve opening 454 deforms to form a gap, which allows a gas flow to the container body 10. Alternatively, when the elasticity of the valve is overcome as a positive pressure is applied to the second passage 459, the valve opening 454 deforms to form a gap, which allows a gas flow to the container body 10.

In some embodiments, the filter(s) 43 may be arranged in a gas flow path from a gas supply source to a gas discharge port inside the container body 10 separately from the valve unit 40 (50).

In the above embodiment and modifications thereof, the valve unit 40 (50) is described as being configured to be attached to the through hole 18 formed in at least either one of the container body 10 or the lid 20; however, it is not so limited. As with the conventional valve unit disclosed in Japanese Unexamined Patent Publication No. 2019-021736, the valve unit 40 (50) may be configured to be attached in the middle of a gas flow path (pipe) provided in the container body 10 or the like, such as, for example, a gas flow path that communicates with at least either one of the supply port 16 or the exhaust port 17.

The invention claimed is:

1. A substrate storage container, comprising:
   a container body configured to store a substrate;
   a lid that closes an opening of the container body; and
   a valve unit that controls a flow of gas to the container body, wherein the valve unit comprises:

an elastic valve having a valve opening that connects a first passage communicating with an outside of the container body to a second passage communicating with an inside of the container body,
a holding member that holds the elastic valve, and
a clamping cap that is inserted in the elastic valve and secures the elastic valve to the holding member, and
the valve opening is tightly closed by an elastic force of the elastic valve.

2. The substrate storage container according to claim 1, wherein when a positive pressure is applied to the first passage, the valve opening deforms to form a gap and allows the gas to flow to the container body.

3. The substrate storage container according to claim 1, wherein when a positive pressure is applied to the second passage, the valve opening deforms to form a gap and allows the gas to flow to the container body.

4. The substrate storage container according to claim 1, wherein
the valve unit has a filter that filters the gas, and
the holding member holds the filter.

5. The substrate storage container according to claim 2, wherein
the valve unit has a filter that filters the gas, and
the holding member holds the filter.

6. The substrate storage container according to claim 3, wherein
the valve unit has a filter that filters the gas, and
the holding member holds the filter.

* * * * *